United States Patent [19]
Frederick et al.

[11] Patent Number: 5,455,546
[45] Date of Patent: Oct. 3, 1995

[54] HIGH POWER RADIO FREQUENCY DIVIDER/COMBINER

[75] Inventors: Thomas L. Frederick, Liberty; David E. Jones, Quincy, both of Ill.

[73] Assignee: Glenayre Electronics, Inc., Charlotte, N.C.

[21] Appl. No.: 311,344

[22] Filed: Sep. 22, 1994

[51] Int. Cl.⁶ ........................................ H01P 5/12
[52] U.S. Cl. ........................................ 333/128; 333/136
[58] Field of Search ........................ 333/127, 128, 333/136

[56] References Cited

U.S. PATENT DOCUMENTS

| | | | |
|---|---|---|---|
| 4,595,891 | 6/1986 | Cronauer | 333/127 |
| 4,647,879 | 3/1987 | Vaddiparty | 333/127 |
| 4,721,929 | 1/1988 | Schnetzer | 333/127 |
| 4,835,496 | 5/1989 | Schellenberg et al. | 333/128 |
| 5,021,755 | 6/1991 | Gustafson | 333/128 |

FOREIGN PATENT DOCUMENTS

| | | | |
|---|---|---|---|
| 26302 | 2/1986 | Japan | 333/128 |
| 203604 | 8/1990 | Japan | 333/128 |
| 37212 | 2/1993 | Japan | 333/127 |

*Primary Examiner*—Paul Gensler
*Attorney, Agent, or Firm*—Christensen, O'Connor, Johnson & Kindness

[57] ABSTRACT

An N-way power divider/combiner having isolated outputs using printed circuit board geometry that forms a ring of power resistors and output transmission lines spiraling around the ring to reduce the size of the circuit is disclosed. Both sides of the printed circuit board are used to achieve further size advantages. The invention thus provides a high-power radio frequency divider/combiner circuit that is much smaller than previous circuits that are able to handle equivalent power levels.

7 Claims, 5 Drawing Sheets

HIGH POWER RADIO FREQUENCY DIVIDER/COMBINER

FIELD OF THE INVENTION

The present invention relates to radio frequency (RF) signal divider/combiners and, more particularly, to small, high-power, n-way signal divider/combiners.

BACKGROUND OF THE INVENTION

RF signal divider/combiners are used in the electronics industry to either divide or combine RF signals. When operating as a signal divider, one input signal is divided into a plurality of output signals, each retaining the same signal characteristics but having a lower power level than the input signal. As a power combiner, a plurality of input signals is combined into a single output signal, with the output signal having the signal characteristics of the sum of the plurality of input signals. Thus, a divider/combiner can operate as either a signal divider or a signal combiner, depending on the direction of the signals.

The electronics industry typically uses "Wilkinson" divider/combiners. In a Wilkinson divider, an input signal is split through the use of several one-quarter wavelength ($\frac{1}{4}\lambda$) impedance matching transformers and output impedance lines. The same device, operating in reverse, serves as a signal combiner. A Wilkinson divider/combiner is illustrated in FIG. 1.

Referring to FIG. 1, a Wilkinson divider/combiner is indicated generally by the numeral 10. As a signal divider, the circuit comprises a single input port 11 (or output port, when operating as a signal combiner) with four corresponding output ports 12 (or input ports when acting as a combiner) and four resistive elements 13, as well as their associated interconnections. Although four output (or input) ports are shown, any number, n, of output (or input) ports may be used. The Wilkinson circuit thus operates to either divide one input into n outputs or combine n inputs into one output.

The Wilkinson divider/combiner, however, has limited power handling capability. The "resistive star" created by the resistive elements 13 make the Wilkinson circuit difficult to realize in practice. In microstrip embodiments, for example, many Wilkinson divider/combiners are subject to signal crossover, resulting in ineffective circuit isolation. In addition, the resistors commonly used for the resistive elements 13 generally limit the power-handling capability of the Wilkinson device to less than 100 watts.

Other divider/combiners have been developed to replace Wilkinson divider/combiners in high power situations. The Gysel divider/combiner is one such circuit, shown in FIG. 2. This divider/combiner circuit is indicated generally by the numeral 20. In the Gysel divider/combiner, operating as a signal divider, an input signal is applied to an input port 21. A plurality of $\frac{1}{4}\lambda$ transmission lines 24 divide the input signal among a plurality of output ports 22. Other transmission lines 25 connect each of the output ports to shunt-connected resistors 27. Additional transmission lines 26 connect each of the resistors 27.

The Gysel-type divider/combiner offers advantages in implementation over the Wilkinson-type divider combiner because it avoids the use of a resistive star. In addition, the transmission lines and shunt-connected resistors of the Gysel-type divider/combiner allow it to achieve much higher power-handling abilities. Unfortunately, the increased power-handling abilities come at the expense of increased size. Because of the long transmission lines, the Gysel-type divider/combiner is relatively large.

Other power divider and power combiners are exemplified by U.S. Pat. No. 4,721,929 to Schnetzer, U.S. Pat. No. 4,595,891 to Cronauer, U.S. Pat. No. 5,021,755 to Gustafson, U.S. Pat. No. 4,647,879 to Vaddiparty, and U.S. Pat. No. 4,835,496 to Schellenberg et al. These patents each teach circuitry that is operative to combine or divide power. However, for the above reasons with respect to the Wilkinson and Gysel circuits, these combiner/dividers do not provide optimal performance in a high power, low space enviroment.

Accordingly, it is an object of the present invention to develop a microwave divider/combiner that is relatively small but has high power-handling abilities.

SUMMARY OF THE INVENTION

The present invention provides an improved high power RF divider/combiner. The invention includes power resistors formed into the shape of a ring. Spiraling out therefrom are output transmission lines. This allows a significant reduction in the size of the printed circuit board required to contain the circuit. Additional size savings may be obtained by using both sides of the printed circuit board. The result is a power divider/combiner that is much smaller than previous circuits that are able to handle equivalent power levels.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
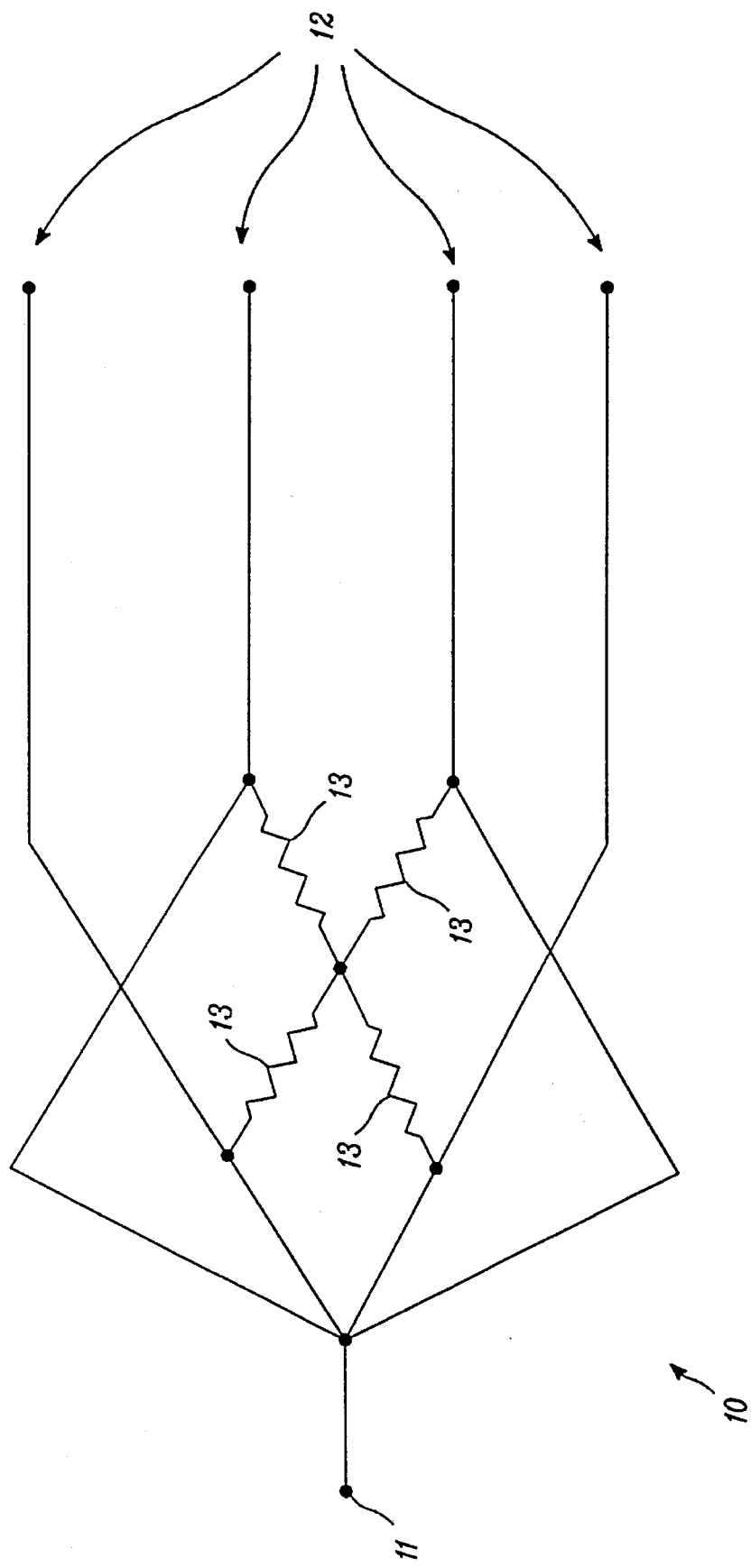
FIG. 1 is a typical Wilkinson signal divider/combiner.
Figure 2:
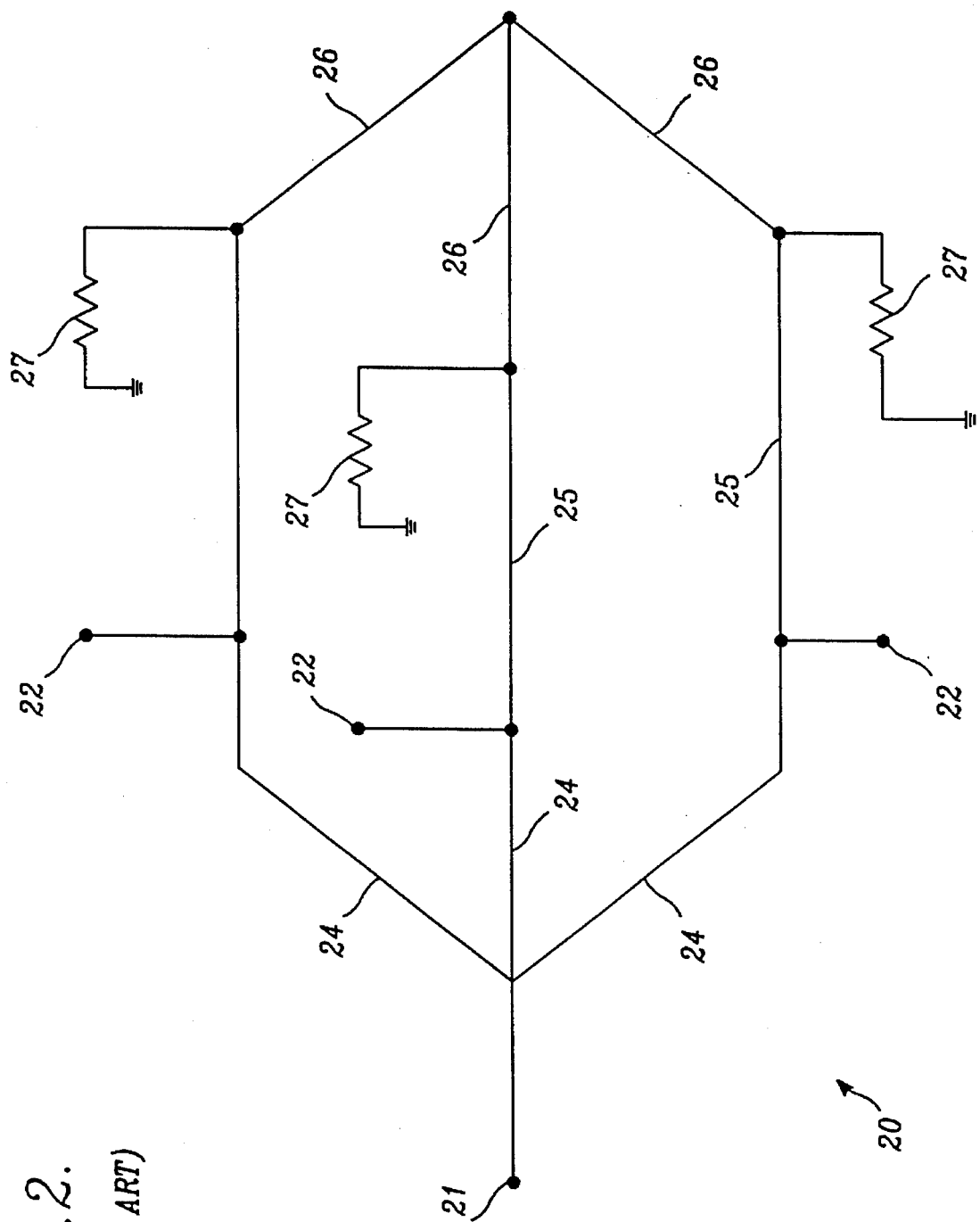
FIG. 2 is a typical Gysel signal divider/combiner.
Figure 3:
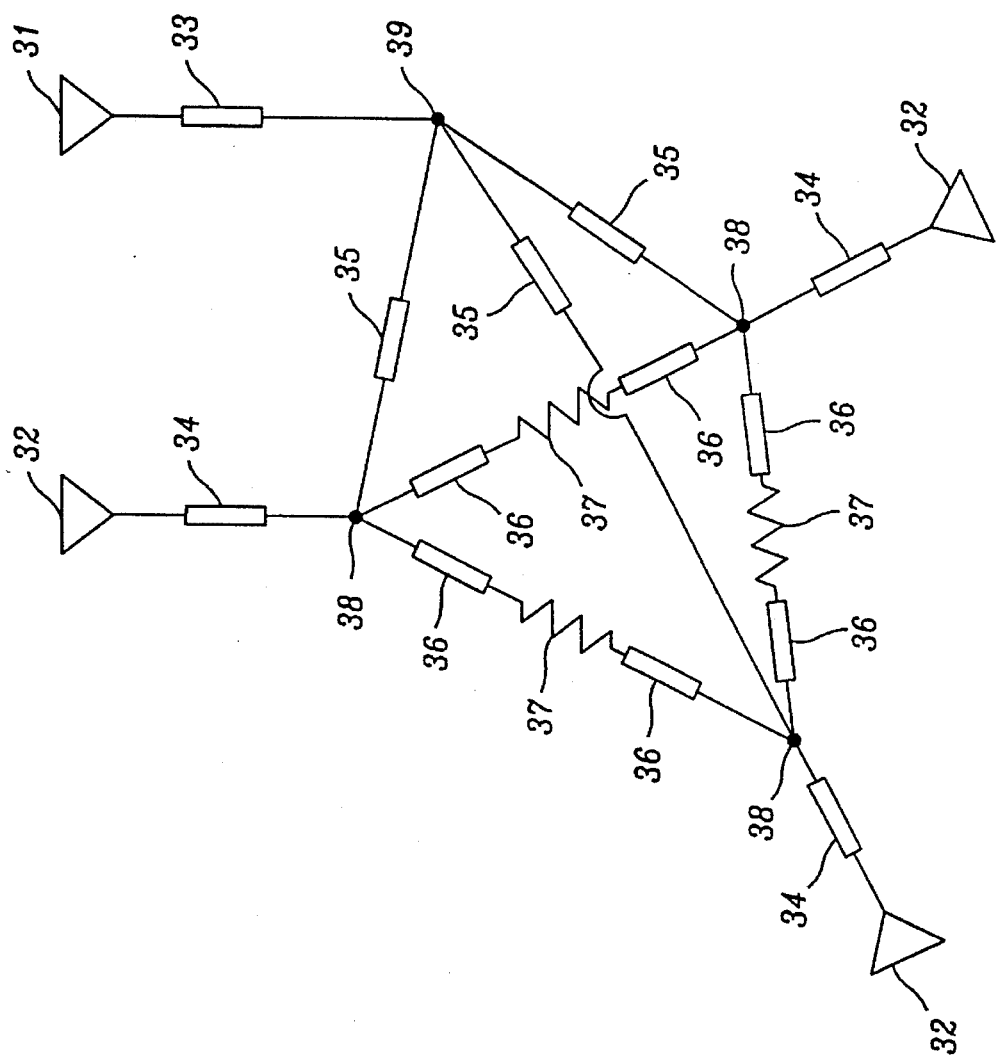
FIG. 3 is a circuit diagram of the preferred embodiment of the present invention.

Referring to FIG. 3, a circuit schematic for a 3-way divider/combiner of the present invention is identified generally by the numeral 30. Although a 3-way divider/combiner is shown, a divider/combiner of the present invention could be implemented to divide or combine any number, n, of signals. When used as a signal divider, a signal applied to the input port 31 travels across first transmission line 33 and is evenly divided at node 39 among a plurality of second transmission lines 35. Power resistors 37 and impedance elements 36 are connected between the ends of each of the second transmission lines 35 to form a ring. The power resistors 37 dissipate power when input power amplitude and phase imbalances are present. A plurality of third transmission lines 34 connects each of the divided signals to a plurality of output ports 32. Impedance values for the transmission lines 33, 34, 35 are chosen to provide impedance match between the input port 31 and the output ports 32. Likewise, impedance values for impedance elements 36 and power resistors 37 are chosen to provide adequate isolation between ports 32. The same circuit may be used as a signal combiner by using the previous input port 31 as an output port and the previous output ports 32 as input ports. In this manner, a plurality of input signals is combined into a single output signal.

The circuit gains size advantages by forming a ring of power resistors and spiraling the third transmission lines connected to the output ports around the ring formed by the power resistors. In addition, the present invention takes advantage of both sides of a printed circuit board to further reduce its size. The input port, first transmission-line, and plurality of second transmission lines are on the bottom side of a printed circuit board, while the power resistors, impedance elements, and plurality of third transmission lines connected to the output ports are on the top side. As a result, the invention allows a high power divider/combiner to be much smaller than devices in the prior art.

Figure 4:
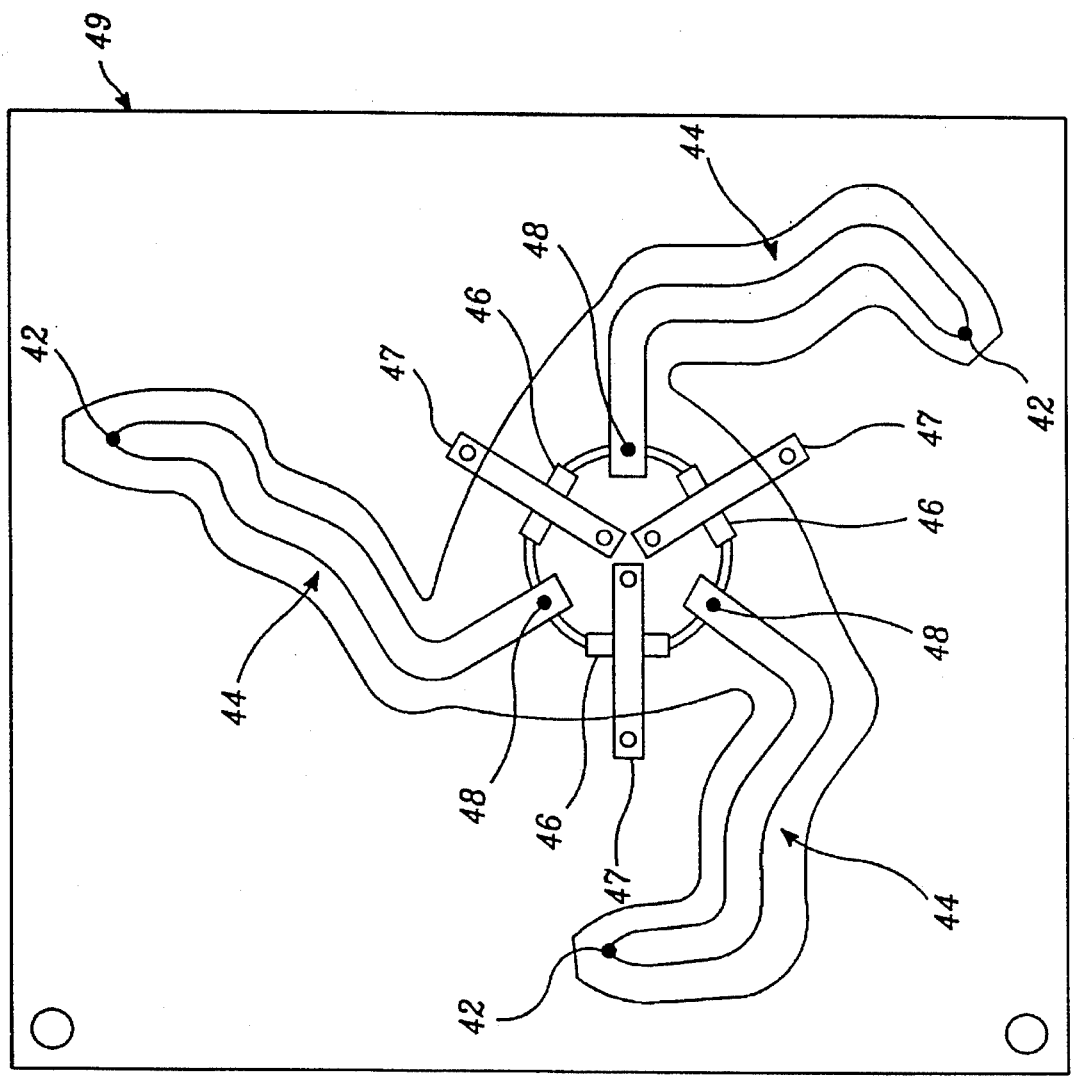
FIG. 4 is a bottom plan view of a 3-way divider/combiner formed in accordance with the present invention.

Referring to FIG. 4, a bottom plan view of a 3-way signal divider/combiner formed in accordance with the present invention is indicated generally by the numeral 40. FIG. 4 shows the circuit elements disposed on the bottom side 49 of a dielectric substrate, which in the preferred embodiment is a printed circuit board. Input ports 42 are provided at the ends of each of three input transmission lines 44. At the opposite end of each of the input transmission lines 44 are termination points 48. A pair of impedance elements 46 and a flanged power resistor 47 are connected between each of the three termination points 48 to form a ring. Transmission lines 44 are spiraled around the ring of flanged power resistors 47 and impedance elements 46.

Figure 5:
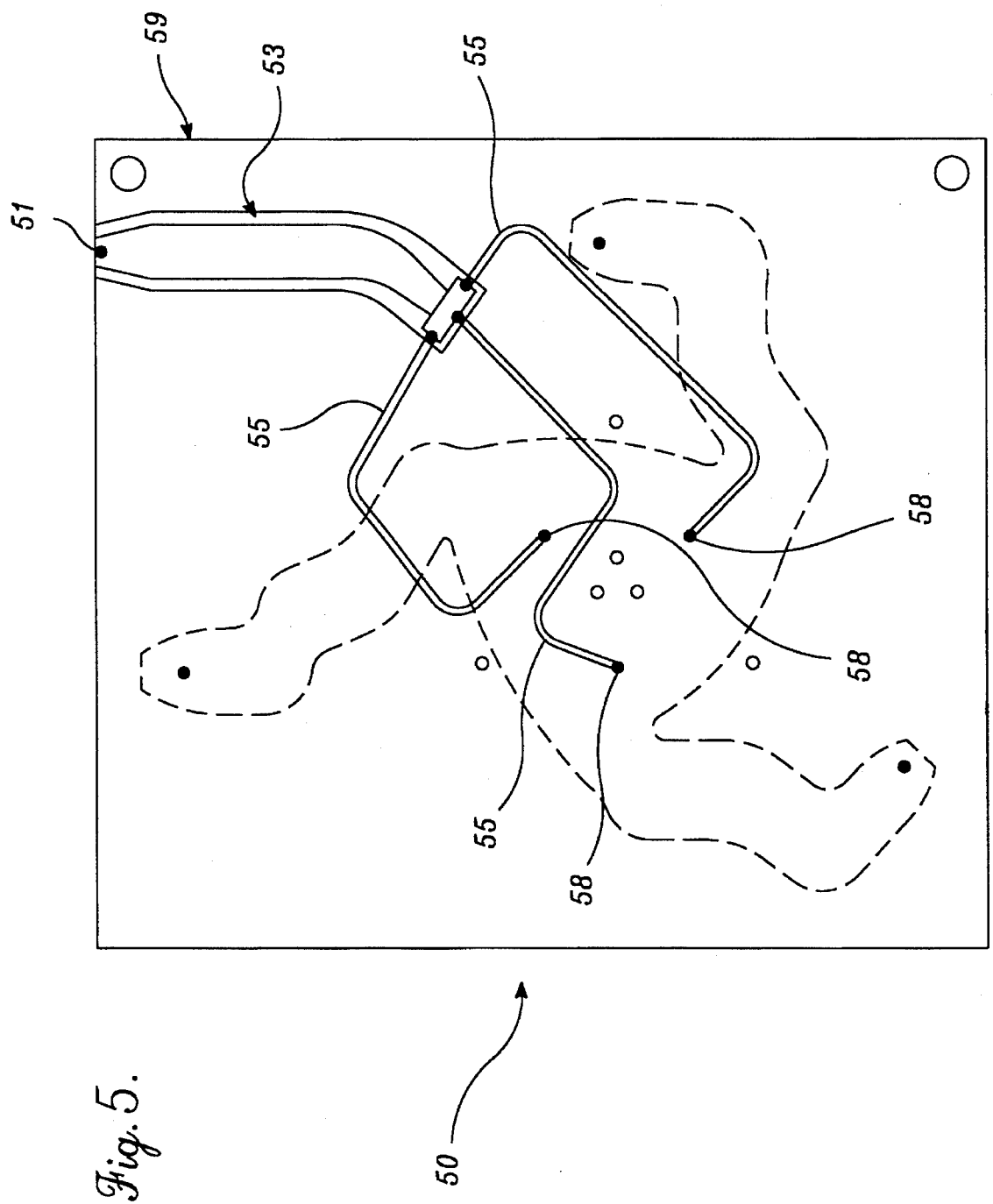
FIG. 5 is a top plan view of a 3-way divider/combiner formed in accordance with the present invention.

Referring to FIG. 5, the top side 59 of the dielectric substrate is shown. The top side of the dielectric substrate and the elements mounted on it are indicated generally by the numeral 50. Termination points 58 are connected to their corresponding termination points 48 on the bottom side of the printed circuit board 49. Semirigid coaxial cables 55 are connected to each of the termination points 58. The opposite ends of the semirigid coaxial cables 55 are all connected to one end of output transmission line 53. The output transmission line 53 terminates in a single output port 51.

Output transmission lines 55, input transmission lines 44, flanged power resistors 47, and impedance elements 46 are chosen to provide isolation between input ports 42 and to provide impedance matching between the input ports 42 and the output port 51. In the preferred embodiment, the length of the semirigid coaxial cables 55 are ¼λ, resulting in an impedance of about 50 Ω at 900 MHz. At 900 MHz the coaxial cables are approximately 63.5 mm in length. Output transmission line 53 is chosen to be about ⅔ of the impedance of the semirigid coaxial cables 55. Input transmission lines 44 are chosen to be about ⅔ of the impedance of the semirigid coaxial cables 55. Additionally, in the preferred embodiment, flanged resistors 47, having an impedance of approximately 100 ohms, are slightly capacitive. Thus, impedance elements 46 are chosen to be slightly inductive.

As an example of the circuit's operation as a signal combiner, a 50 w signal may be applied to each of the three input ports 32 in FIG. 3. The input signals travel across transmission lines 34 and transmission lines 35. The signals are then combined at node 39 and travels across transmission line 33 as a single RF power signal. The combined 150 w signal finally appears at output port 31. Power resistors 37 dissipate power when amplitude and phase imbalances are present.

Although the above detailed description has described the present invention as a signal combiner, the same embodiment may operate as a signal divider when signals are applied in the opposite direction. Thus, the output port 31 would then become an input port. Likewise, the input ports 32 would become output ports. Operated in this manner, a single input signal would be evenly divided into a plurality of output signals. For example, a single 150 w signal may be applied to input port 31. The signal travels across transmission line 33 and is divided evenly into three 50 w signals at node 39. The three 50 w signals travel across transmission lines 35 and transmission lines 34 to output ports 32.

As an example of the space savings of the present invention, at 900 MHz, the present invention allows a signal divider/combiner with a 500 w capability to be implemented on a printed circuit board that is approximately 3½ inches by 3½ inches. An equivalent-power Gysel divider/combiner would require a printed circuit board of about 12 inches by 5 inches.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. An electrical circuit for dividing a radio frequency signal having a frequency into a plurality of radio frequency signals or combining a plurality of radio frequency signals into a single radio frequency signal, comprising:

a first transmission line having two ends;

a port connected to the first end of said first transmission line;

a plurality of second transmission lines having first and second ends, the first end of each said second transmission lines connected to the second end of said first transmission line;

a plurality of power resistors, each one of said plurality of power resistors connected to a pair of impedance elements in series, each of said combination of one power resistor and two impedance elements connected to two of said second ends of said second transmission lines to form a ring;

a plurality of third transmission lines having first and second ends, the first ends of said third transmission lines connected to a corresponding one of said second ends of said second transmission lines, said third transmission lines emanating outwardly from said ring in a curving manner; and a plurality of ports, each of one of said ports connected to a corresponding one of said second ends of said third transmission lines.

2. The device of claim 1 wherein said first transmission line, said second transmission lines, said power resistors, said impedance elements, and said third transmission lines are formed onto a dielectric substrate comprising a printed circuit board having top and bottom sides.

3. The device of claim 2 wherein said first transmission line and said plurality of second transmission lines are disposed on the top side of said printed circuit board, and said plurality of third transmission lines, impedance elements, and power resistors are disposed on the bottom side of said printed circuit board.

4. The device of claim 3 wherein said second transmission lines comprise semi-rigid coaxial cable.

5. The device of claim 1 wherein said second transmission lines have a length of substantially one-quarter wavelength of said frequency of said radio frequency signal.

6. The device of claim 5 wherein said first transmission line has an impedance approximately two-thirds of the impedance of said second transmission lines and said third transmission lines have an impedance approximately two-thirds of said second transmission lines.

7. The device of claim 1 wherein said first transmission line has an impedance approximately two-thirds of the impedance of said second transmission lines and said third transmission lines have an impedance approximately two-thirds of the impedance of said second transmission lines.

* * * * *